US009182559B2

United States Patent
Mitsuhashi et al.

(10) Patent No.: US 9,182,559 B2
(45) Date of Patent: Nov. 10, 2015

(54) LIGHT-RECEIVING PACKAGE FOR FLAT-PLATE MOUNTING, AND OPTICAL MODULE

(71) Applicants: NTT ELECTRONICS CORPORATION, Kanagawa (JP); NIPPON TELEGRAPH AND TELEPHONE CORPORATION, Tokyo (JP)

(72) Inventors: Yuji Mitsuhashi, Yokohama (JP); Toshiki Nishizawa, Yokohama (JP); Ikuo Ogawa, Atsugi (JP); Ryoichi Kasahara, Atsugi (JP)

(73) Assignees: NTT ELECTRONICS CORPORATION, Kanagawa (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 14/370,673

(22) PCT Filed: Dec. 4, 2012

(86) PCT No.: PCT/JP2012/081396
§ 371 (c)(1),
(2) Date: Jul. 3, 2014

(87) PCT Pub. No.: WO2013/103063
PCT Pub. Date: Nov. 7, 2013

(65) Prior Publication Data
US 2014/0369644 A1 Dec. 18, 2014

(30) Foreign Application Priority Data
Jan. 5, 2012 (JP) .................................. 2012-000363

(51) Int. Cl.
*G02B 6/00* (2006.01)
*G02B 6/42* (2006.01)
(Continued)

(52) U.S. Cl.
CPC ................ *G02B 6/4295* (2013.01); *G02B 6/12* (2013.01); *G02B 6/13* (2013.01); *G02B 6/4203* (2013.01);
(Continued)

(58) Field of Classification Search
None
See application file for complete search history.

(56) References Cited

U.S. PATENT DOCUMENTS 7,618,201 B2 * 11/2009 Ibe et al. ..................... 385/93
2003/0174959 A1 9/2003 Morris, Jr. et al.
(Continued)

FOREIGN PATENT DOCUMENTS

CN 1582405 2/2005
EP 1491928 A2 12/2004
(Continued)

OTHER PUBLICATIONS

International Search Report dated Feb. 12, 2013 corresponding to PCT/JP2012/081396, 2 pp.
(Continued)

*Primary Examiner* — Uyen Chau N Le
*Assistant Examiner* — Hoang Tran
(74) *Attorney, Agent, or Firm* — Ohlandt Greeley Ruggiero & Perle L.L.P.

(57) ABSTRACT

A light-receiving package for flat-plate mounting which can make monitor reception sensitivity of an optical signal constant without increasing the size of a module. The light-receiving package for flat-plate mounting is provided with a first subassembly in which a photo diode is fixed to a front surface of a retaining holder, a back surface of the retaining holder is a flat surface capable of moving parallel on a plane parallel to a light-receiving surface of the photo diode and a second subassembly which has a rectangular U-shaped concave holder for retaining the retaining holder, and a flat-plate base disposed on a substrate and in which a surface of the flat-plate base that is mounted on the substrate is a flat surface capable of moving parallel to a substrate surface, the rectangular U-shaped concave holder and the flat-plate base are fixed, at least one of surfaces of the concave holder having a rectangular U-shape being a flat surface is a flat surface capable of moving parallel to the back surface of the retaining holder.

5 Claims, 7 Drawing Sheets (51) Int. Cl.
*G02B 6/12* (2006.01)
*G02B 6/13* (2006.01)
*H01L 31/0203* (2014.01)

(52) U.S. Cl.
CPC ............ *G02B 6/4265* (2013.01); *G02B 6/4286* (2013.01); *H01L 31/0203* (2013.01); *G02B 2006/12138* (2013.01)

(56) References Cited

U.S. PATENT DOCUMENTS

| | | | |
|---|---|---|---|
| 2004/0264865 | A1 | 12/2004 | Joo et al. |
| 2004/0264891 | A1 | 12/2004 | Namiwaka et al. |

FOREIGN PATENT DOCUMENTS

| | | |
|---|---|---|
| JP | 01241504 | 9/1989 |
| JP | 05333248 | 12/1993 |
| JP | 08122582 | 5/1996 |
| JP | 2001249241 | 9/2001 |
| JP | 2002357743 | 12/2002 |
| JP | 2005017839 | 1/2005 |
| JP | 2008090128 | 4/2008 |

OTHER PUBLICATIONS

International Preliminary Report on Patentability dated Jul. 17, 2014 corresponding to PCT/JP2012/081396, 2 pp.

Written Opinion of the International Searching Authority dated Feb. 12, 2013 corresponding to PCT/JP2012/081396, 5 pp.

Chinese Office Action dated Jun. 2, 2015 corresponding to Chinese Patent Application No. 201310000558.5; 15 pages.

European Search Report dated Sep. 8, 2015 corresponding to European Application No. 12864605.6; 7 pages.

* cited by examiner

LIGHT-RECEIVING PACKAGE FOR FLAT-PLATE MOUNTING, AND OPTICAL MODULE

TECHNICAL FIELD

The present invention relates to a light-receiving package for flat-plate mounting, which is mounted with a monitor PD (PhotoDiode), and an optical module.

BACKGROUND ART

Figure 6:
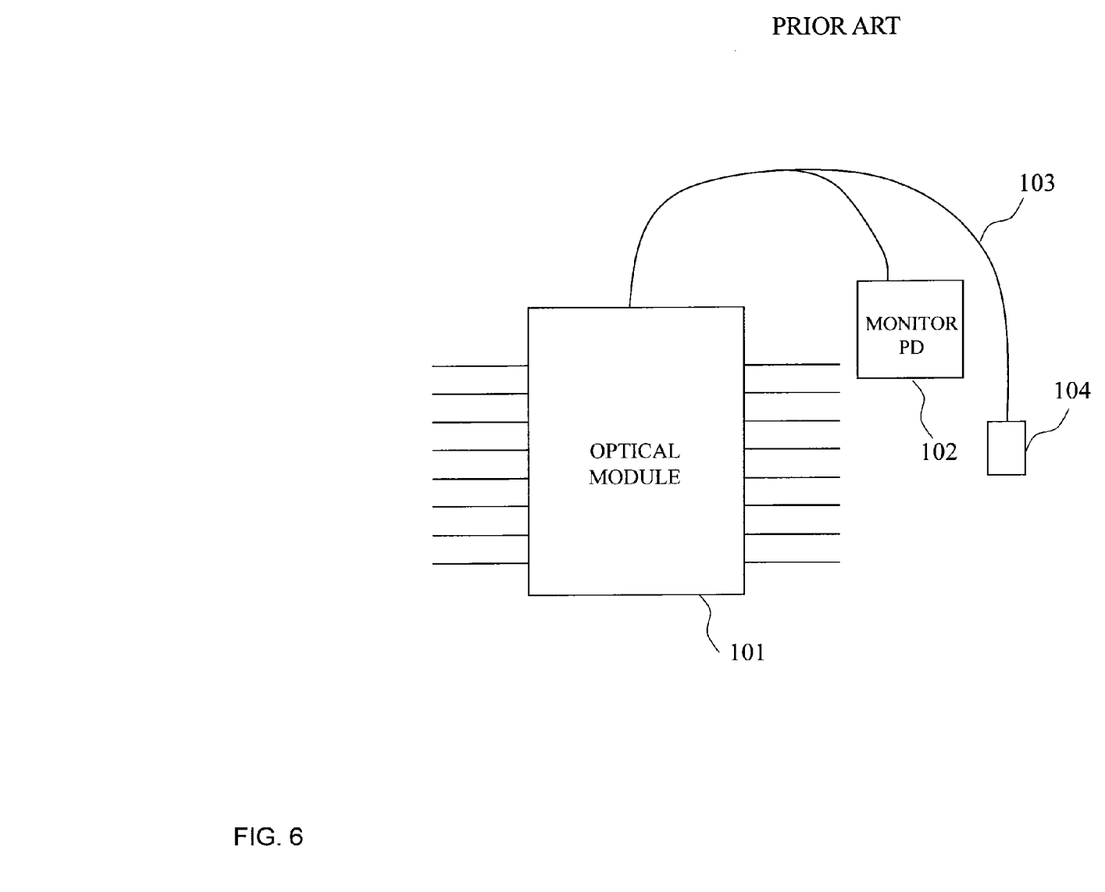
FIG. 6 shows a monitor PD mounting example of Patent Literature 1.

A conventional monitor PD 102 has a coaxial structure with a fiber, and, as shown in FIG. 6, an optical signal is tapped to an optical fiber 103 of an optical module 101 to connect the monitor PD 102 by fusion bonding and, thus, to monitor an output of the optical signal (for example, see Patent Literature 1).

Figure 7:
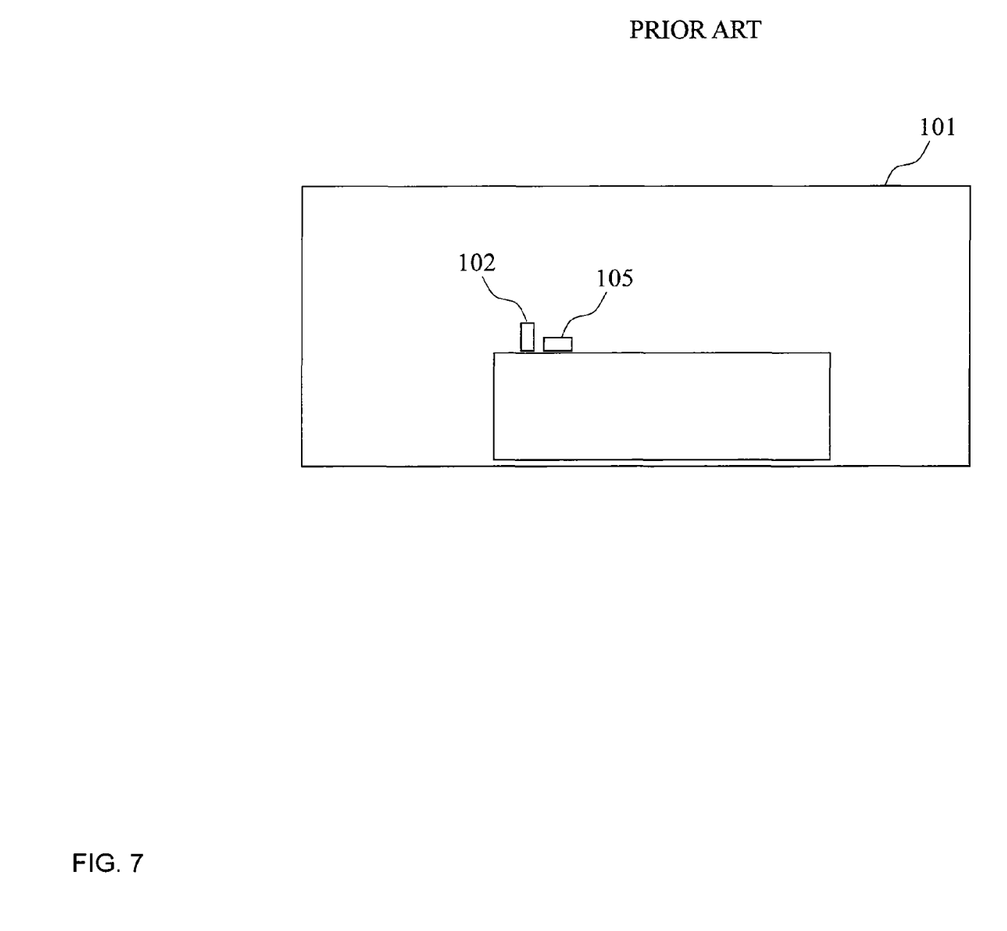
FIG. 7 shows a monitor PD mounting example of Patent Literature 2.

FIG. 7 shows a conventional example in which the monitor PD 102 is integrated in the optical module 101 (for example, see Patent Literature 2). In the prior art, the monitor PD 102 is in a form in which a PD bare chip is mounted on a carrier such as ceramic.

CITATION LIST

Patent Literature

Patent Literature 1: JP 1996-122582 A
Patent Literature 2: JP 2002-357743 A

SUMMARY OF INVENTION

Technical Problem

According to the conventional example of Patent Literature 1, since the monitor PD is connected to the middle of the optical fiber of the optical module, the entire module is increased in size, and it is difficult to arrange and store the optical fiber when a board is implemented.

According to the conventional example of Patent Literature 2, since the PD bare chip is exposed inside the optical module, not only a main optical signal but also a stray light component generated in the optical module are received, and thus it is difficult to stably monitor the optical signal. Further, since the monitor PD is implemented without adjustment, there is a problem that reception sensitivity varies depending on a lot and mounting accuracy.

Thus, an object of the present invention is to provide a light-receiving package for flat-plate mounting and an optical module which can make reception sensitivity constant without increasing the size of a module.

Solution to Problem

In order to achieve the above object, a light-receiving package for flat-plate mounting of the present invention is provided with a first subassembly which has a photo diode and a retaining holder and in which the photo diode is fixed to a front surface of the retaining holder, a back surface of the retaining holder is a flat surface capable of moving parallel on a plane parallel to a light-receiving surface of the photo diode and a second subassembly which has the rectangular U-shaped concave holder for retaining the retaining holder and a flat-plate base disposed on a substrate and in which a surface of the flat-plate base that is mounted on the substrate is a flat surface capable of moving parallel to a substrate surface, the rectangular U-shaped concave holder and the flat-plate base are fixed so that a cut-out side of the rectangular U-shaped concave holder faces above the substrate, and at least one of surfaces of the concave holder having a rectangular U-shape is a flat surface capable of moving parallel to the back surface of the retaining holder.

The second subassembly is provided with the flat-plate base, whereby the photo diode can be installed at a desired position on the substrate. The second subassembly is provided with the rectangular U-shaped concave holder, and the first subassembly is provided with the retaining holder, whereby the photo diode can be moved parallel on a surface parallel to the light-receiving surface of the photo diode, and the monitor PD can be fixed at a position where the reception sensitivity of the monitor PD is proper. According to this constitution, the reception sensitivity of the monitor PD can be made constant and stabilized. Accordingly, the light-receiving package for flat-plate mounting of the present invention can make the reception sensitivity constant without increasing the size of a module.

The optical module of the present invention is provided with a waveguide type optical element which is mounted on the substrate and guides light from an optical fiber and the light-receiving package for flat-plate mounting of the present invention which receives monitor light emitted from the waveguide type optical element after separation of a portion of light propagating through the waveguide type optical element.

Since the optical module of the present invention is provided with the light-receiving package for flat-plate mounting of the present invention, even if the monitor PD is disposed in the optical module, the reception sensitivity of the monitor PD can be made constant. Accordingly, the optical module of the present invention can make the reception sensitivity constant without increasing the size of a module.

In the optical module of the present invention, a light emitting window through which the monitor light emits is provided in an end surface of the waveguide type optical element that is connected to the optical fiber, a photo diode of the light-receiving package for flat-plate mounting is provided with a light entering window for the monitor light, and the light emitting window and the light entering window may be arranged to face each other.

In the optical module of the present invention, since the light emitting window is disposed in the end surface of the waveguide type optical element that is connected to the optical fiber, stray light entering the light entering window can be reduced. Consequently, the optical module of the present invention can monitor signal light accurately.

In the optical module of the present invention, the waveguide type optical element is connected to two optical fibers, the light emitting window emits monitor light from which a portion of light from one of the optical fibers is divided, and the light emitting window and the light entering window may pass the monitor light therethrough and shield stray light in the waveguide type optical element.

In the optical module of the present invention, when signal light and local light enter the waveguide type optical element, only the signal light as the monitor light can be extracted from the light emitting window. Since the light emitting window and the light entering window pass the monitor light therethrough and shield the stray light in the waveguide type optical element, only the monitor light from which the signal light is divided can be made enter the monitor PD. According to this constitution, the optical module of the present invention can monitor the signal light accurately.

Advantageous Effects of Invention

The present invention can provide a light-receiving package for flat-plate mounting and an optical module which can make reception sensitivity of a monitor PD constant and stabilize without increasing the size of a module.

DESCRIPTION OF EMBODIMENTS

An embodiment of the present invention will be described with reference to the accompanying drawings. The embodiment to be described hereinafter is an example of the invention, and the invention is not limited to the following embodiment. Components denoted by the same reference numerals in the present specification and the drawings mutually denote the same components.

An optical module according to the present embodiment is an integrated type receiving FE module corresponding to optical phase modulation accompanying a further increase in communication traffic, that is, a DQPSK transmission method or a DP-QPSK transmission method. A PLC optical demodulator circuit used in those transmission methods is called a delay line interferometer DLI or DPOH (Dual Polarization Optical Hybrid), converts a difference in phase state of an optical signal into a difference in light intensity, and is an optical module which receives and demodulates this by a PD capable of detecting only an intensity difference and integrates a high frequency amplifier which current/voltage converts an electrical signal demodulated by the PD to amplify the converted signal and, thus, to output the amplified signal as a high frequency electrical signal.

Figure 1:
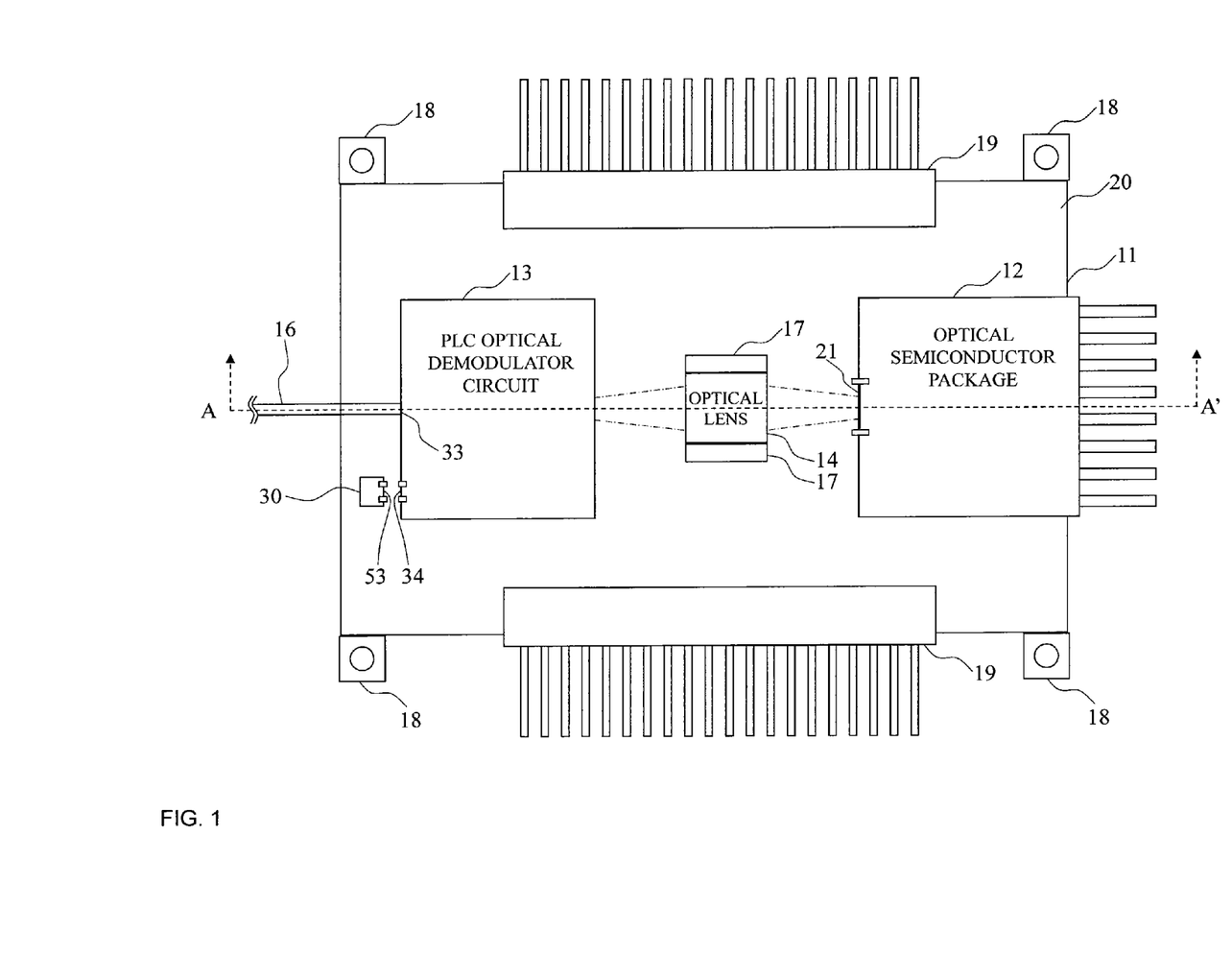
FIG. 1 shows a top view of an optical module according to the present embodiment.
Figure 2:
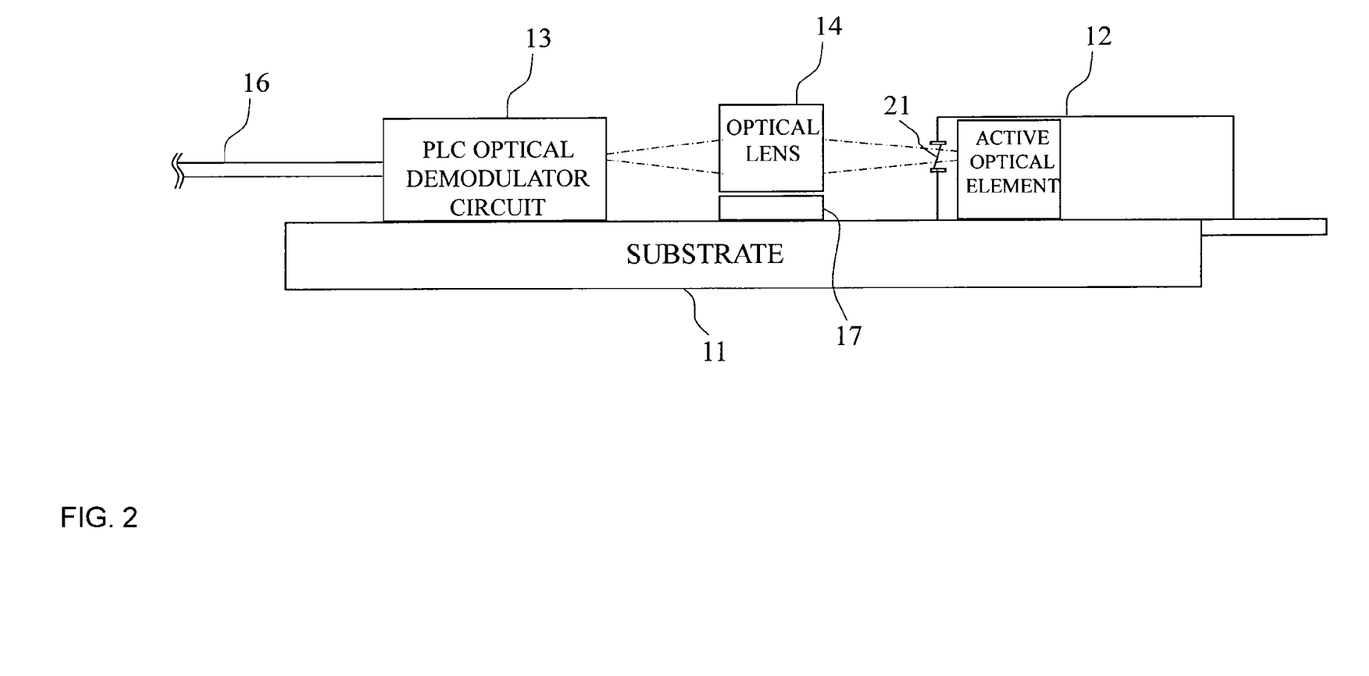
FIG. 2 shows an A-A' cross-sectional view of the optical module according to the embodiment.

FIGS. 1 and 2 show an example of the optical module according to the present embodiment. FIG. 1 is a top view of the optical module according to the embodiment, and FIG. 2 is a side view of the optical module according to the embodiment. The optical module according to the embodiment is provided with a substrate 11, an optical semiconductor package 12, a PLC optical demodulator circuit 13 as a waveguide type optical element, an optical lens 14, a lens retaining holder 17, and a light-receiving package for flat-plate mounting 30. The optical semiconductor package 12 is provided with a receiver for demodulation, and the light-receiving package for flat-plate mounting 30 is provided with a monitor PD.

An optical signal transmitted from an optical fiber 16 enters the PLC optical demodulator circuit 13. The PLC optical demodulator circuit 13 is mounted on the substrate 11 and guides light from the optical fiber 16. In the PLC optical demodulator circuit 13, a waveguide is divided (tapped), and the optical signal is divided into the optical signal travelling toward the receiver for demodulation and an optical signal travelling toward the monitor PD. The optical signal travelling toward the monitor PD is monitor light and is emitted through a light emitting window 34 disposed in an end surface connected to the optical fiber 16. The light emitting window 34 as a PLC light-emitting end is obliquely cut for countermeasure against reflection, and an AR plate is mounted. According to this constitution, reflection as a noise component can be suppressed.

The optical signal for monitor PD reception, that is, monitor light is output through the light emitting window 34 disposed on the side of a fiber input portion 33 and enters the monitor PD in the light-receiving package for flat-plate mounting 30 through a light entering window 53 disposed to face the light emitting window 34. The monitor PD in the light-receiving package for flat-plate mounting 30 receives the monitor light entering through the light entering window 53, and optical sensitivity can be obtained. When the monitor PD is mounted on the side of the fiber input portion 33, it is possible to suppress that the monitor PD receives scattered light generated in a PLC substrate.

Figure 3:
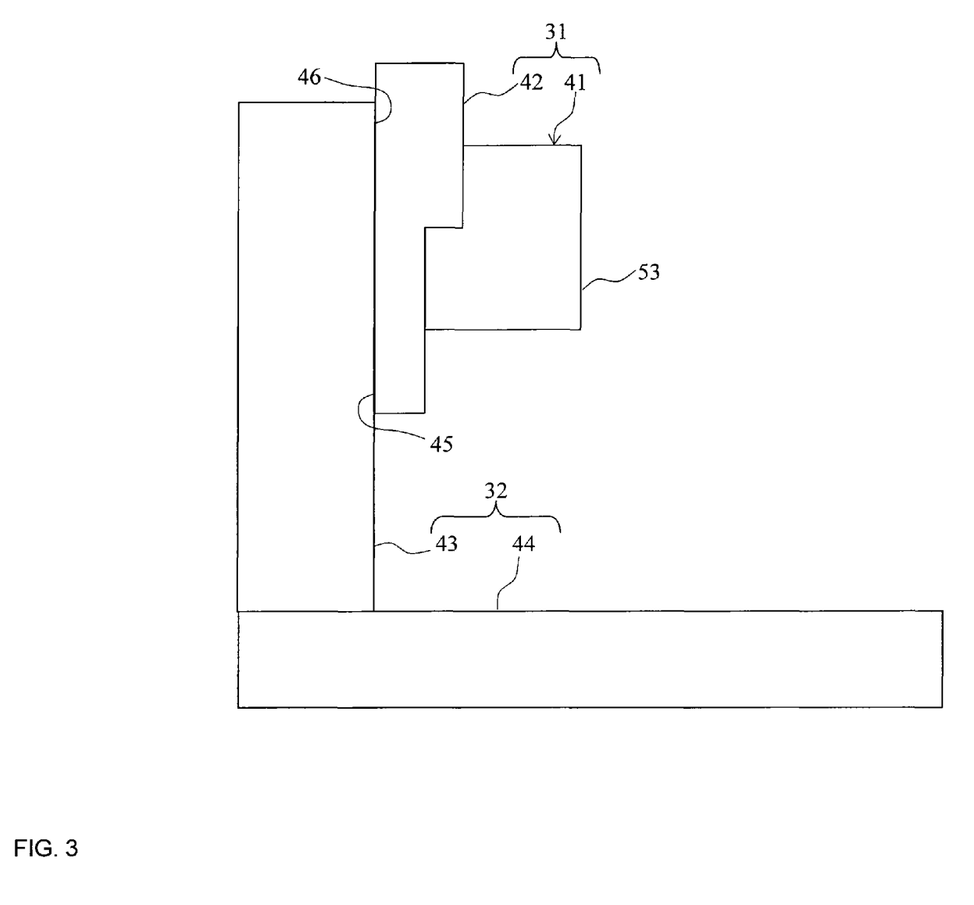
FIG. 3 is a side view of a light-receiving package for flat-plate mounting according to the embodiment.
Figure 4:
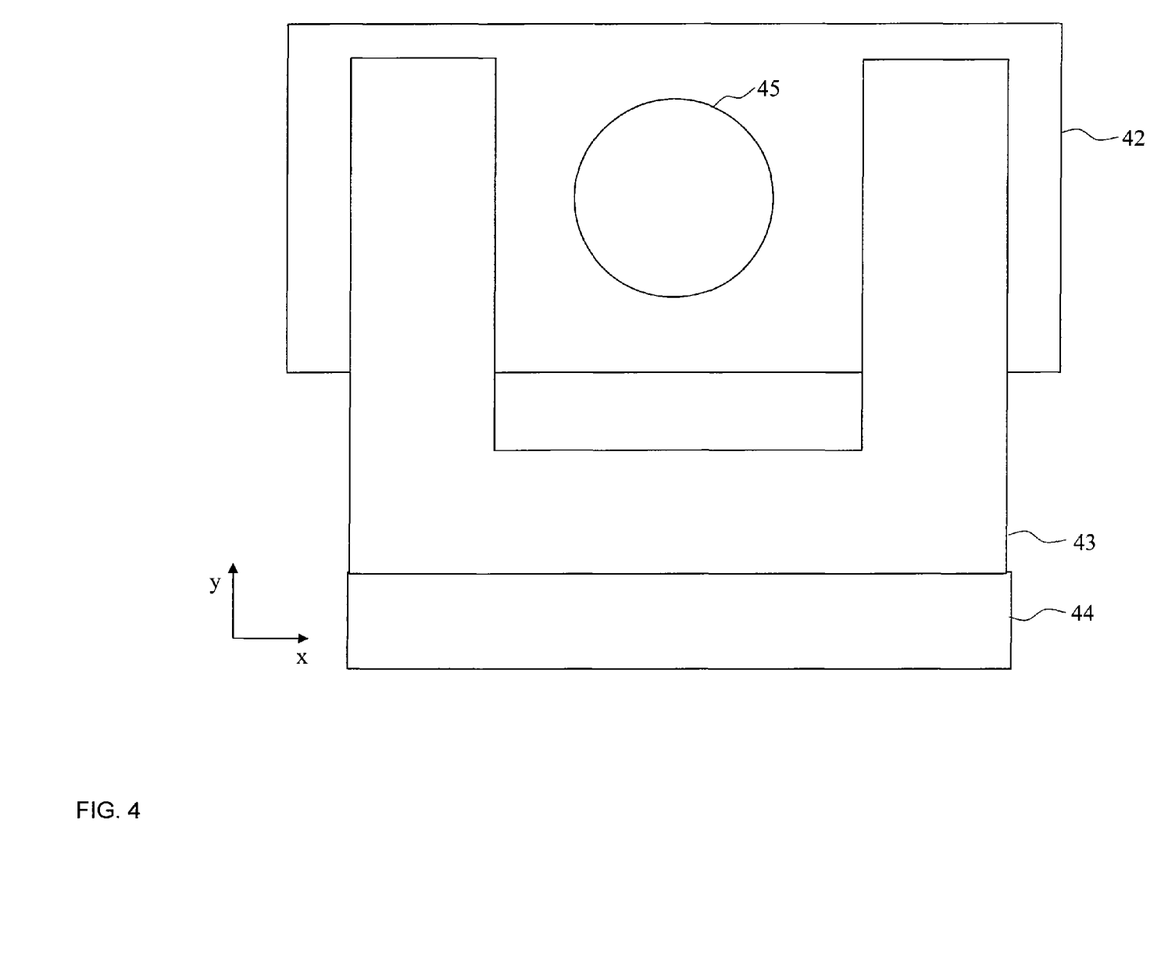
FIG. 4 is a back view of the light-receiving package for flat-plate mounting according to the embodiment.

FIGS. 3 and 4 show an example of the light-receiving package for flat-plate mounting 30. FIG. 3 is a side view of the light-receiving package for flat-plate mounting 30 according to this embodiment, and FIG. 4 is a back view of the light-receiving package for flat-plate mounting 30 according to the embodiment. The light-receiving package for flat-plate mounting 30 according to the embodiment is provided with a first subassembly 31 and a second subassembly 32. The first subassembly 31 is provided with a photo diode 41 and a retaining holder 42. The second subassembly 32 is provided with a rectangular U-shaped concave holder 43 and a flat-plate base 44.

Figure 5:
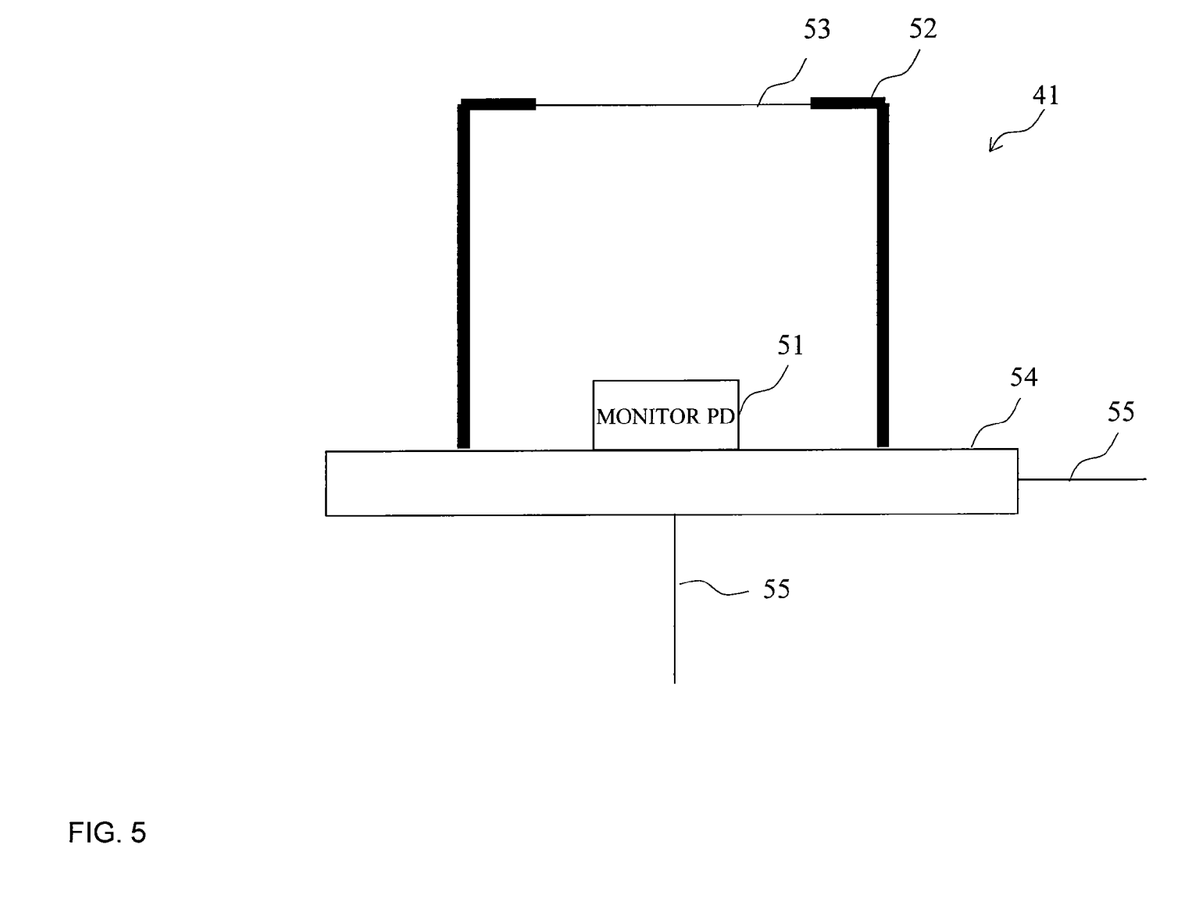
FIG. 5 shows an example of a photo diode according to the embodiment.

In FIG. 5, an example of a photo diode 41 is shown. The photo diode 41 includes a monitor PD 51 mounted on a small-sized CAN-PKG (package). The monitor PD 51 is mounted in the small-sized CAN-PKG, constituted of a flat-plate base 54, a cap 52, and the light entering window 53, and sealed airtightly. Thus, even if the monitor PD 51 is mounted in an unsealed optical module, stabilized operation can be performed. The photo diode 41 can be aligned in the optical module, and stable reception sensitivity can be always obtained. An indirect component such as a lens can be mounted in the small-sized CAN-PKG. When the effective diameters of the light entering window 53 and a lens of the small-sized CAN-PKG are controlled, sufficient cross talk to stray light can be secured.

The light entering window 53 of the small-sized CAN-PKG in which the monitor PD 51 is mounted may be flat glass or lens. The light entering window 53 is a predetermined opening. This can suppress entering of stray light and entering of local light inside a module. Consequently, the reception sensitivity with a suppressed noise component can be obtained.

In a mounting structure, first, the photo diode 41 is fixed to the retaining holder 42 for alignment, and the first subassembly 31 is formed. The retaining holder 42 is preferably a metal material such as Fe—Ni—Co. In a fixing method, an adhesive, laser welding, or the like may be used.

Then, the rectangular U-shaped concave holder 43 is fixed at a predetermined position of the flat-plate base 44, and the second subassembly 32 is formed. At this time, the rectangular U-shaped concave holder 43 and the flat-plate base 44 are fixed so that a cut-out side of the rectangular U-shaped concave holder 43 faces above the substrate 11. The rectangular U-shaped concave holder 43 is fixed onto the flat-plate base 44 with an adhesive or the like. The rectangular U-shaped concave holder 43 is preferably a metal material such as Fe—Ni—Co. The flat-plate base 44 is preferably formed of alumina.

The second subassembly 32 is fixed at a predetermined position on the substrate 11 with an adhesive or the like, for the purpose of retaining the first subassembly 31. The surface of the flat-plate base 44 that is mounted on the substrate 11 is a flat surface capable of moving parallel to the substrate surface and can be disposed at a predetermined position on the substrate 11.

Then, in the optical module a back surface 45 of the retaining holder 42 that faces the light entering window 53 is brought into contact with a PLC-side flat surface 46 of the rectangular U-shaped concave holder 43 of the second subassembly 32, and optical alignment is performed. Since the PLC-side flat surface 46 on which the back surface 45 of the retaining holder 42 is disposed on the PLC optical demodulator circuit 13 side of a surface of the rectangular U-shaped concave holder 43 having a U-shape is a flat surface, optical alignment in an x-y plane parallel to a light-receiving surface of the monitor PD 51 can be performed by rubbing the back surface 45 of the retaining holder 42 with the PLC-side flat surface 46 of the rectangular U-shaped concave holder 43. The alignment is performed in this plane, spot welding using a YAG laser is performed at a position where predetermined reception sensitivity is obtained, and the retaining holder 42 and the rectangular U-shaped concave holder 43 are fixed, whereby the first subassembly 31 is fixed to the second subassembly 32, and the light-receiving package for flat-plate mounting 30 is mounted on the substrate 11. According to this constitution, the reception sensitivity of the monitor PD can be made constant.

Electrical connection is performed from a lead 55, output from the small-type CAN-PKG mounted with the monitor PD 51, to a ceramic terminal 19 inside the optical module by wire bonding.

The PLC optical demodulator circuit 13 may be connected to the two optical fibers 16. For example, signal light enters the PLC optical demodulator circuit 13 through one of the optical fibers 16, and local light enters the PLC optical demodulator circuit 13 through the other optical fiber 16. In this case, the PLC optical demodulator circuit 13 divides only a portion of the signal light as monitor light and emits the monitor light through the light emitting window 34. At this time, since the local light is dispersed in the PLC optical demodulator circuit 13, stray light of the local light may emit through the light emitting window 34. Thus, a slit is provided on an optical axis of the monitor light divided in the PLC optical demodulator circuit 13 and emitted through the light emitting window 34. For example, the light emitting window 34 and the light entering window 53 are each provided with a slit passing the monitor light therethrough and shielding stray light in the waveguide type optical element. The slits of the light emitting window 34 and the light entering window 53 are formed by reducing the opening diameters of the light emitting window 34 and the light entering window 53. According to this constitution, entering of local light can be reduced, and sufficient cross talk can be secured.

As described above, the present invention can provide a receiving FE module with a built-in monitor PD, which can make the reception sensitivity constant and perform stabilized operation.

INDUSTRIAL APPLICABILITY

The present invention is applicable to information and communication industry.

REFERENCE SIGNS LIST

11: substrate
12: optical semiconductor package
13: PLC optical demodulator circuit
14: optical lens
16: optical fiber
17: lens retaining holder
18: flange
19: ceramic terminal
30: light-receiving package for flat-plate mounting
31: first subassembly
32: second subassembly
33: fiber input portion
34: light emitting window
41: photo diode
42: retaining holder
43: a rectangular U-shaped concave holder
44: flat-plate base
45: back surface of retaining holder
46: PLC-side flat surface of a rectangular U-shaped concave holder
51: monitor PD
52: cap
53: light entering window
54: flat-plate base
55: lead
101: optical module
102: monitor PD
103: optical fiber
104: connector
105: LD

What is claimed is:

1. A light-receiving package for flat-plate mounting comprising:
   a first subassembly having a photo diode and a retaining holder, the photo diode being fixed to a front surface of the retaining holder, and a back surface of the retaining holder being a flat surface capable of moving parallel on a plane parallel to a light-receiving surface of the photo diode; and
   a second subassembly having a rectangular U-shaped concave holder for retaining the retaining holder and a flat-plate base disposed on a substrate, a surface of the flat-plate base that is mounted on the substrate being a flat surface capable of moving parallel to a substrate surface, the rectangular U-shaped concave holder and the flat-plate base being fixed so that a cut-out side of the rectangular U-shaped concave holder faces above the substrate, and at least one of surfaces of the concave holder having a rectangular U-shape being a flat surface capable of moving parallel to the back surface of the retaining holder.

2. An optical module comprising:
   a waveguide type optical element mounted on the substrate and guides light from an optical fiber; and
   the light-receiving package for flat-plate mounting according to claim 1, which receives monitor light emitted from the waveguide type optical element after separation of a portion of light propagating through the waveguide type optical element.

3. The optical module according to claim 2,
wherein the waveguide type optical element comprises a light emitting window, through which the monitor light emits, in an end surface connected to the optical fiber,
a photo diode of the light-receiving package for flat-plate mounting comprises a light entering window for the monitor light, and
the light emitting window and the light entering window are arranged to face each other.

4. The optical module according to claim 3,
wherein the waveguide type optical element is connected to two optical fibers,
monitor light from which a portion of light from one of the optical fibers is divided is emitted through the light emitting window, and
the light emitting window and the light entering window have a slit passing the monitor light therethrough and shielding stray light in the waveguide type optical element.

5. A method of manufacturing a light-receiving package for flat-plate mounting, comprising, in order, the steps of:
fabricating a first subassembly in which a photo diode is fixed to a front surface of a retaining holder, and a back surface of the retaining holder is a flat surface capable of moving parallel on a plane parallel to a light-receiving surface of the photo diode and fabricating a second subassembly which has a rectangular U-shaped concave holder for retaining the retaining holder and a flat-plate base disposed on a substrate and in which a surface of the flat-plate base that is mounted on the substrate is a flat surface capable of moving parallel to a substrate surface, and at least one of surfaces of the concave holder having a rectangular U-shape is a flat surface capable of moving parallel to the back surface of the retaining holder;
fixing the second subassembly onto the substrate;
performing optical alignment by bringing the back surface of the retaining holder of the first subassembly into contact with the one of the surfaces of the rectangular U-shaped concave holder of the second subassembly; and
fixing the retaining holder and the rectangular U-shaped concave holder by spot welding at a position where predetermined reception sensitivity is obtained in the optical alignment step.

\* \* \* \* \*